(12) United States Patent
Risen, Jr. et al.

(10) Patent No.: US 6,319,551 B1
(45) Date of Patent: Nov. 20, 2001

(54) METHODS AND COMPOSITIONS FOR FORMING SILICA, GERMANOSILICATE AND METAL SILICATE FILMS, PATTERNS AND MULTILAYERS

(76) Inventors: William M. Risen, Jr., 87 Miller Ave., Rumford, RI (US) 02916; Yong Zhong Wang, 30 E. Transit St., #3, Providence, RI (US) 02912; Scott Bredall, 136 Roy Ct., Helena, AL (US) 35080

( * ) Notice: Subject to any disclaimer, the term of this patent is extended or adjusted under 35 U.S.C. 154(b) by 0 days.

(21) Appl. No.: 09/091,460

(22) PCT Filed: Dec. 18, 1996

(86) PCT No.: PCT/US96/20559
§ 371 Date: May 10, 1999
§ 102(e) Date: May 10, 1999

(87) PCT Pub. No.: WO97/24223
PCT Pub. Date: Jul. 10, 1997

Related U.S. Application Data

(60) Provisional application No. 60/009,001, filed on Dec. 19, 1995.

(51) Int. Cl.[7] .............................. B05D 3/02; B05D 5/06; B32B 18/00
(52) U.S. Cl. ................... 427/226; 427/282; 427/419.2; 427/419.3; 428/447; 428/472
(58) Field of Search .................................. 427/226, 282, 427/419.2, 419.3; 428/447, 448, 429, 469, 472

(56) References Cited

U.S. PATENT DOCUMENTS

| | | | | |
|---|---|---|---|---|
| 4,495,297 | * | 1/1985 | Puyane et al. | 501/12 |
| 4,501,602 | * | 2/1985 | Miller et al. | 65/18.2 |
| 4,965,091 | * | 10/1990 | Fratello et al. | 427/64 |
| 5,063,003 | * | 11/1991 | Gozales-Oliver | 264/14 |
| 5,069,600 | * | 1/1992 | Schnur et al. | 427/553 |
| 5,112,676 | * | 5/1992 | Cot et al. | 427/226 |
| 5,120,570 | * | 6/1992 | Boaz | 427/553 |
| 5,152,819 | * | 10/1992 | Blackwell et al. | 427/255.37 |
| 5,368,887 | * | 11/1994 | Hoshino et al. | 427/226 |
| 5,370,903 | * | 12/1994 | Mine et al. | 427/226 |
| 5,466,483 | * | 11/1995 | Niwa | 427/226 |
| 5,525,264 | * | 6/1996 | Cronin et al. | 427/108 |
| 5,686,548 | * | 11/1997 | Grainger et al. | 427/407.1 |
| 5,863,595 | * | 1/1999 | Camilletti et al. | 427/226 |

* cited by examiner

*Primary Examiner*—Shrive P. Beck
*Assistant Examiner*—Michael Cleveland
(74) *Attorney, Agent, or Firm*—Fay, Sharpe, Fagan, Minnich & McKee, LLP

(57) ABSTRACT

This invention is directed to novel silica compositions, metal silicates, germanosilicates, and metal germanosilicates, and patterned objects and films comprising the same. It also includes methods and compositions for making these films and patterned objects on substrates, ranging from silicon wafers to optical fibers, silica, sapphire, quartz and borosilicate glass. These methods incorporate the use of certain precursor compositions, procedures for their application to a substrate and subsequent treatment to produce a patterned object and/or the conversion to glass structures.

15 Claims, 2 Drawing Sheets

METHODS AND COMPOSITIONS FOR FORMING SILICA, GERMANOSILICATE AND METAL SILICATE FILMS, PATTERNS AND MULTILAYERS

This application is a 371 of PCT/US96/20559, filed Dec. 18, 1996, which claims priority to provisional application No. 60/009001, filed Dec. 19, 1995.

This invention was made with government support under Contract No. 49620-93-1-0049 from the U.S. Air Force Office of Scientific Research. Consequently, the Government may have certain rights in this invention.

FIELD OF THE INVENTION

The present invention is directed to methods for forming thin films and patterned objects of silica, germania or germanosilica materials and the compositions utilized to produce such films and objects. Further, the invention is directed to the products produced by the methods of the present invention.

BACKGROUND OF THE INVENTION

Silica ($SiO_2$) films are of great interest to the semiconductor, optical and other industries. The silica films can be prepared by several methods such as thermal oxidation, physical vapor deposition, thermal vapor deposition, chemical vapor deposition and spin-on glass (SOG) technology.

The SOG materials are organsilicon polymers that can be synthesized by the hydrolysis of various silanes. There are two types of SOG materials such as p-SOG materials and s-SOG materials. The p-SOG materials are essentially polysiloxanes with inert organic groups such as methyl, ethyl, phenyl, etc. The s-SOG materials are basically silicate-like materials with reactive side chains such as hydroxyl, methoxy, ethoxy, etc. These silicone or silicate materials generally are only capable of making silica films with a thickness of less than 1 micrometer or otherwise cracking results during the steps of heating or oxygen plasma treatment.

In order to solve this problem, new types of carboxylated polysiloxanes have been synthesized. These new carboxylated polysiloxanes exhibit improved abilities to form silica and silicate films.

An additional advantage of the new carboxylated polysiloxanes is that their carboxyl groups can be ion-exchanged by metal ions to form metal doped polysiloxane films. These films can be transformed into metal doped silicate films through thermal oxidation or other means.

The further advantage of the new carboxylated polysiloxane compositions is that methyl groups or vinyl groups in the materials, when spread on substrates, can be used for cross-linking (such as by photolytic crosslinking) to form insoluble siloxane films or patterns in the shape of the image made by the photolysis source. This source can be light passed through a mask or light of a laser beam directed to specified regions of the material. After removal of uncrosslinked material, the crosslinked, carboxylated silicone patterns then can be ion-exchanged with metal ions, such as alkali, alkaline earth, transition metal, and rare earth metal ions to form metal-doped siloxane patterns. The metal doped polysiloxane patterns can then in turn be oxidized into metal silicate patterns which can be used as waveguide structures and optical, electrooptical, or magneto-optical devices.

In this regard, in the planar waveguide structures, a higher refractive index often is needed in the guided region than that of its cladding. One known way to achieve such an index step is to exchange some of the cations in a sodium borosilicate glass. The exchange process is started by masking off the area where the index is to be left unchanged. A metal salt such as silver iodide is painted over the surface of the planar waveguide blank. The blank is then heated to 300° C. to 400° C. where ion exchange takes place (diffusion of the sodium out and silver in). After being cooled, the planar waveguide is ground and polished to allow coupling into optical systems.

Waveguide structures also can be produced by laser densification of sol-gel silica glass. For normal glass, there would be no densification effect upon laser heating or heat treatments by other means. With sol-gel silica, partially dense type VI silica can be used as a substrate. Upon laser heating, the region under the focused beam is densified. This will form a multimode waveguide region of 40 $\mu$m wide with a refractive index difference of 0.06 between the waveguided region and the substrate.

In the preparation of a waveguide structure through a sol-gel method, ethanol, HCl/water, germanium ethoxide ($Ge(OC_2H_5)_4$) and tetraethylorthosilicate (TEOS) are mixed together to form multi-component sol. Substrates are dip coated with the sol, and coatings are fired after every 10–12 dippings. The film is heated in the temperature range of 300–1100° C. and densified at the temperature 850–1100° C. The film is found to be of high optical quality.

Moreover, it often is desirous to have a region, such as a layer, whose refractive index is higher than that of the lightguided region, so it will be advantageous to produce germanium containing SOG materials which will be used to form germanosilicate films for waveguide applications. The present invention is directed to this objective and others. Specifically, one object of the invention to use germanium containing silicone compositions to formgermanosilicate films and multilayers for construction of waveguide structures.

These and other objects and advantages of the invention, as well as the details of an illustrative embodiment, will be more fully understood from the following specification and drawings.

BRIEF DESCRIPTION OF THE DRAWINGS

The following is a brief description of the drawings which are presented for the purpose of illustrating the invention and not for the purposes of limiting the same.

SUMMARY OF THE INVENTION

Figure 1:
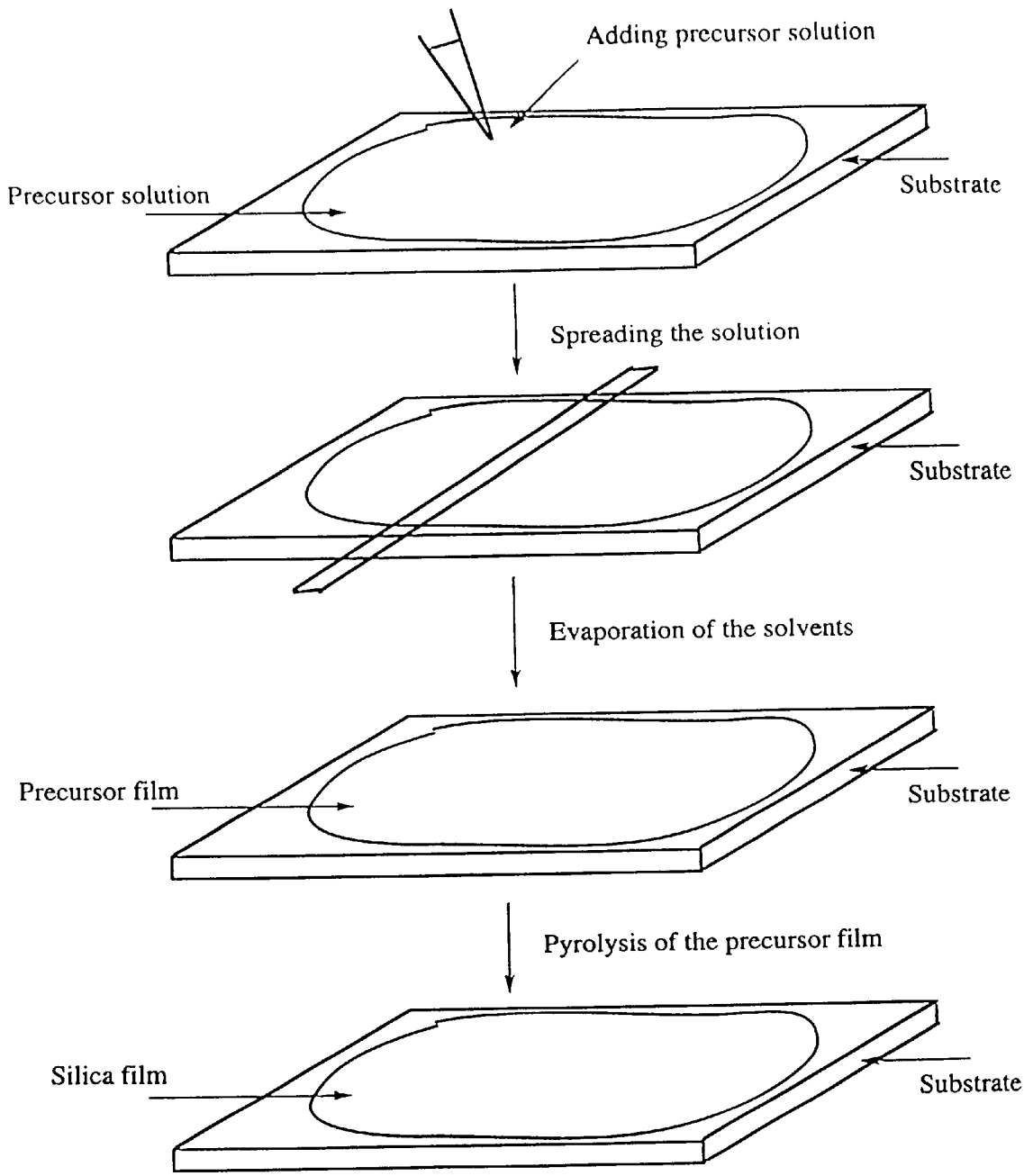
FIG. 1 shows a method for applying the precursor film, leading to subsequent thermal oxidation.
Figure 2:
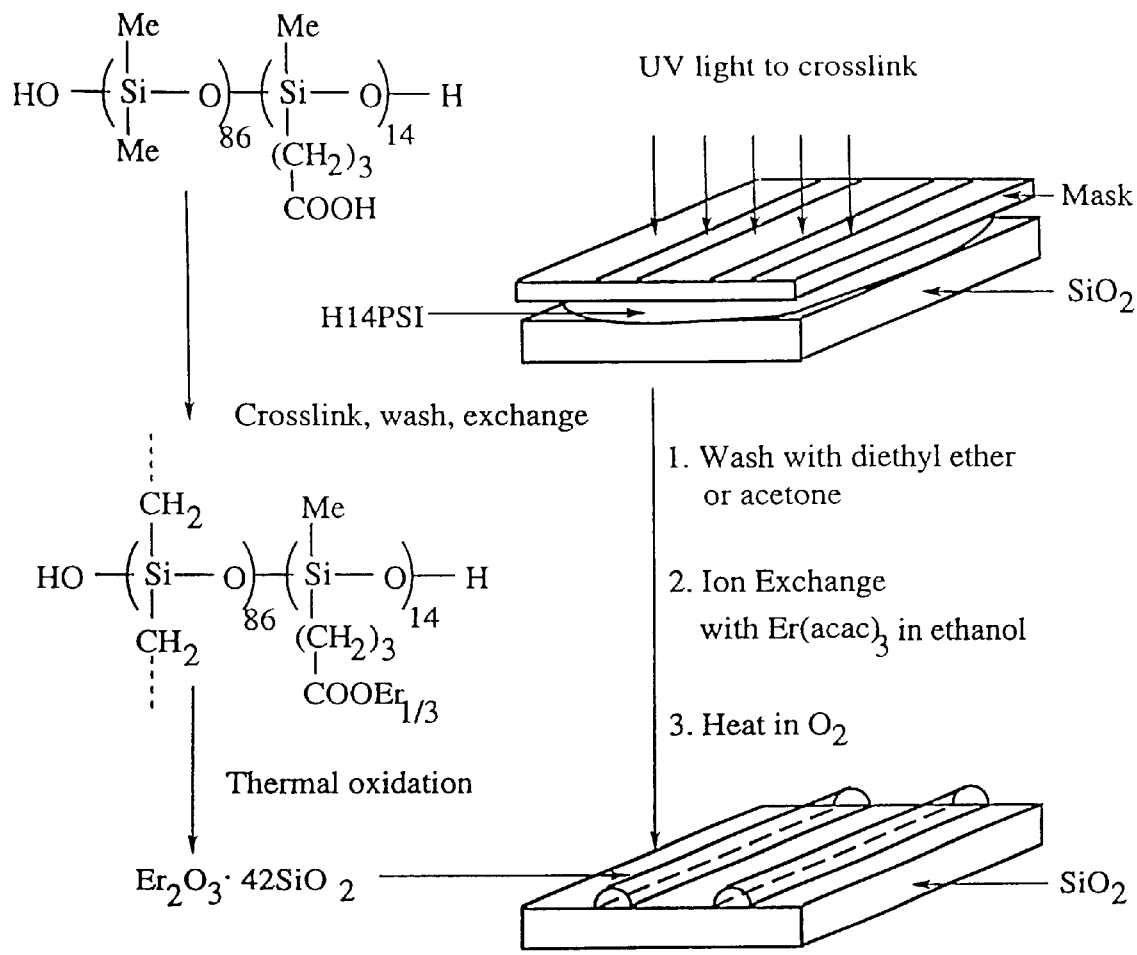
FIG. 2 shows the application of ultraviolet light through a mask to photoinitiate the crosslinking of the exposed regions and the schematic reaction path and process steps of the method for producing shaped regions of a lanthanide silicate glass on a substrate.

The present invention relates to methods of forming silica, gennanosilicate, and metal silicate films, patterns and multilayer films on substrates such as silicon, silica or oxide glasses from carboxylated silicones and carboxylated germanosilicones. Additionally, the invention is directed to the products produced utilizing the methods of the invention.

The methods of forming silica, germanosilicate, and metal silicate and metal germanosilicate films in the invention include but are not limited to: a process for preparing acid copolymers containing silicone and germ anosilicone materials, such as carboxylated polysiloxanes and carboxylated polygermanosiloxanes and their metal exchanged forms; a method of forming films from these materials; a method of photoimaging these silicone films; a method of forming precursor patterns and, a method of thermally oxidizing the silicone films or patterns.

In a method of forming carboxylated silicone films, a carboxylated silicone is dissolved in an organic solvent such as acetone, ethanol and diethyl ether, and the solution is applied (such as by dip coating or spin coating) to the surface of a substrate. The carboxylated silicone film formed on the substrate is subsequently heated in a furnace up to 600° C. to transform the silicone film into a silica film. The substrate can be but is not limited to a silicon wafer, silica, oxide glasses, silica coated silicon, or metal silicate coated silicon.

In the method of forming patterned silica on a substrate, a photo-crosslinkable precursor such as carboxylated silicone precursor film (with an optional photosensitizer) is exposed to ultraviolet light or other radiation, such as through a mask or by a laser or other directed radiation source, to render it insoluble (ie cross-linked) in the region exposed to the ultraviolet light or other radiation. The carboxylated silicone film is then washed with solvent such as acetone, ethanol, or diethyl ether to dissolve away uncross-linked silicone materials and to leave behind a pattern of cross-linked silicone material on the surface of the substrate. The carboxylated silicone pattern can then be optionally dipped into a metal acetylacetonate or other metal-containing compound in ethanol or another solvent in which the patterned film is substantially insoluble to achieve full or partial ion exchange. The resulting metal-doped silicone pattern is then heated up to 600° C. to form a metal-doped silicate pattern. Optionally, the pattern can be a layer of the metal-doped silicate, or a sequence of layers in which some or all of the layers are metal-doped metal silicate of the same or varied composition.

The foregoing, as well as other aspects of the invention will be discussed in the following detailed description of the invention.

DETAILED DESCRIPTION OF THE INVENTION

It has been found that films and patterned objects made of silica, germanosilica and ion-containing glasses can be prepared by transforming acid copolymers containing siloxane or germanosiloxane polymeric compounds (i.e. carboxylated silicone precursor compositions). To form the thin films and/or patterned objects, the acid copolymers containing the siloxane or germanosiloxane are placed on a substrate (such as a silicon wafer) to form a precursor film. The precursor film is subsequently heated in an oxygen-containing atmosphere resulting in the production by thermal oxidation of the films and patterned objects of the invention.

Furthermore, the present invention is also directed to a method for forming a silica film having a desired pattern on a substrate. The method involves the steps of: preparing a carboxylated silicone precursor composition; depositing the carboxylated silicone precursor composition on the surface of a substance to form a precursor film; masking the precursor film with a mask having a desired pattern; exposing the masked precursor film to radiation thereby cross-linking the precursor film in the exposed regions to form a pattern; washing the precursor film from the substrate and leaving cross-linked precursor film in the form of a pattern on the substrate; and, thermally oxidizing the cross-linked precursor film in the form of a pattern on the substrate. Alternately, the exposure of the precursor film to a pattern of radiation to form a crosslinked precursor film in the form of a pattern can be accomplished utilizing a directed source of radiation such as a laser beam or a focused directed beam of light. Moreover, the present invention further relates to a method for forming a metal doped silicate film on a substrate. The method involves the steps of: preparing a carboxylated silicone precursor composition; depositing the carboxylated silicone precursor composition on the surface of a substance to form a precursor film; exposing the precursor film to radiation thereby cross-linking the precursor film; applying to the cross-linked precursor film a metal organic composition thereby forming a metal doped precursor film by ion exchange; and, thermally oxidizing the metal doped precursor film to form a metal doped silicate glass.

Additionally, the invention pertains to a method for forming a pattern of metal doped silicate film on a substrate. The method involves the steps of: preparing a carboxylated silicone precursor composition; depositing the carboxylated silicone precursor composition on the surface of a substrate to for a precursor film; masking the precursor film with a mask having a desired pattern; exposing the masked precursor film to radiation thereby cross-linking the unmasked precursor film to form a pattern; washing the precursor film with an organic solvent to remove the uncrosslinked precursor film from the substrate and leaving the crosslinked precursor film on the substrate in the form of a pattern; applying a metal organic composition to the crosslinked precursor film thereby forming by ion exchange a metal doped precursor film; and, thermally oxidizing the metal doped precursor film to form a pattern of a metal doped silicate film on a substrate. Alternately, the exposure of the precursor film to a pattern of radiation to form a crosslinked precursor film in the form of a pattern can be accomplished utilizing a directed source of radiation such as a laser beam or a focused directed beam of light. Thus the patterned objects are formed by crosslinking an acid copolymer on the substrate by a patterned exposure to the appropriate radiation (such as ultraviolet light), subsequently washing away the soluble uncrosslinked material, ion-exchanging the substantially insoluble crosslinked regions and then heating the resultant material in an oxygen containing atmosphere. In the cases in which crosslinking is utilized, a photoinitiator can be optionally used.

A. PREPARATION OF THE POLYSILOXANE AND POLYGERMANOSILOXANE PRECURSOR COMPOSITIONS

The formation of the carboxylated silicones and gormanosilicones are described in the following preparations:

1. Preparation of Poly(carboxypropylmethyl)Siloxane (H100PSI)

A sample of 20 mL of 3-cyanopropylmethyldichlorosilane was placed in a round bottom flask and stirred while 4.2 mL of water was added dropwise. The mixture was stirred at room temperature for 4 hours and then heated in a water bath at about 70° C. for 20 hours to form cyano-containing polysiloxane. Then 20 mL of 8M HCl was added to the flask to hydrolyze the cyano groups into carboxylic acid groups. The hydrolysis was carried out at 70° C. for about 24 hours. Next, 50 mL of water was added to the flask to dissolve HCl and $NH_4Cl$ trapped inside of the carboxylated polysiloxane. The water was allowed to stay on the top of the viscous product for 6 hours. The water with HCl and $NH_4Cl$ was decanted, and 50 mL of water was added to the flask again. This step was repeated several times until the pH value of the decanted water was about 7. Then, 100 mL of acetone was added to the flask to dissolve the product. The acetone phase was separated from $NH_4Cl$ on the bottom of the flask, and then dried with anhydrous $Na_2SO_4$ overnight. Acetone was then evaporated at reduced pressure. The resultant product (H100PSI) was very viscous. The structure of H100PSI is shown in Formula 1 below:

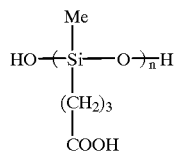

Formula 1 where n = 4–10,000

2. Preparation of a Carboxylated Polysiloxane Copolymer, HmPSI (wherein HmPSI refers to the carboxylated polysiloxane copolymer with m Mole % carboxylated groups), with 14 mol % Carboxylated Groups, H14PSI.

First, 10 mL of dichlorodimethylsilane (Aldrich Company) and 2.13 mL of 3-cyanopropylmethyldichlorosilane (United Chemical Technologies, Inc.) were added to a flask and mixed under dry $N_2$ flow for 5 minutes. 2.2 mL of water was then added drop by drop to the flask to hydrolyze the silane mixture. Gaseous HCl evolved immediately after the addition of water. The mixture was stirred at room temperature for 4 hours and at 70° C. for another 20 hours. At this stage, the Si—Cl bonds of the silanes were effectively hydrolyzed and hydrolyzed moieties had condensed to form viscous cyano-containing siloxane copolymer. About 20 mL of 8M HCl was added to the flask to hydrolyze the cyano groups into carboxylic acid groups. The hydrolysis of cyano groups was carried out at 70° C. for 24 hours. Diethyl ether was added to the flask to extract the product. The ether solution of the product was washed with water to remove any HCl and $NH_4Cl$ trapped in the product. The solution was then dried with anhydrous $Na_2SO_4$. The evaporation of the ether at reduced pressure (Rotavapor) left a viscous carboxylated siloxane copolymer in the flask. The composition of 14 mol % carboxyl-containing polysiloxane, H14PSI, is represented by the following general formula (Formula 2).

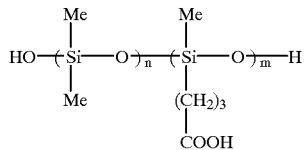

Formula 2 where n and m are the mole fractions such that n+m=1, n=0.86 and m=0.14 for H14PSI.

3. Preparation of a Carboxylated Polysiloxane Copolymer with 50 mol % Carboxylated Groups, H50PSI.

First, 10 mL of dichlorodimethylsilane (Aldrich Company) and 13.11 mL of 3-cyanopropylmethyldichlorosilane (United Chemical Technologies, Inc.) were added to a flask and mixed under dry $N_2$ flow for 5 minutes. 2.2 mL of water was then added drop by drop to the flask to hydrolyze the silane mixture. Gaseous HCl evolved immediately after the addition of water. The mixture was stirred at room temperature for 4 hours and at 70° C. for another 20 hours. At this stage, the Si—Cl bonds of the silanes were effectively hydrolyzed and hydrolyzed moieties had condensed to form viscous cyano-containing siloxane copolymer. About 20 mL of 8M HCl was added to the flask to hydrolyze the cyano groups into carboxylic acid groups. The hydrolysis of cyano groups was carried out at 70° C. for 24 hours. Diethyl ether was added to the flask to extract the product. The ether solution of the product was washed with water to remove any HCl and $NH_4Cl$ trapped in the product. The solution was then dried with anhydrous $Na_2SO_4$. The evaporation of the ether at reduced pressure (Rotavapor) left a viscous carboxylated siloxane copolymer in the flask. The composition of this 50 mol % carboxyl-containing polysiloxane, H50PSI, is represented the following general formula:

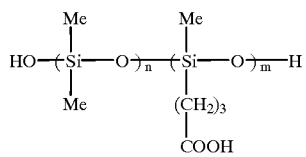

Formula 2 where n and m are the mole fractions such that n+m=1, n=0.50 and m=0.50 for H50PSI.

4. Preparation of Carboxylated Polygermanosiloxanes, CPGS

The carboxyl-containing polygernanosiloxanes or CPGSs used as precursors in the invention have the general Formula 3 (see below) in which $R_1$–$R_5$ are alkyl groups such as methyl groups, $R_6$ is $(CH_2)_3$ and n, m, and k are mole fractions such that n+m+k=1 with k/(n+m+k) ranging from 0.1 to 0.60.

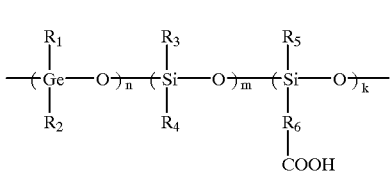

Formula 3

The carboxylated polygermanosiloxane, CPGS, involving methyl groups was synthesized as follows. First, a carboxylated siloxane, H100PSI, was synthesized as described in Preparation 1. A sample of the H100PSI (0. 4657 g) was mixed with 20.0 mL $H_2O$ and 0.3966 g NaOH and kept in a capped glass bottle for 3 days at 70° C. The resultant solution was placed in a 125 mL flask at 25° C. and 80 mL of diethyl ether was added. Then 0.26 mL of dichlorodimethyl germane and, 2.1 mL of dichlorodimethylsilane were added to this mixture. The two phases were stirred for 3 hours at 25° C. with a reflux condenser in place. Then the ether phase was separated and dried with anhydrous sodium sulfate. Then the ether was evaporated from the ether solution at reduced pressure to yield a viscous fluid product. It was shown by infrared spectroscopy to contain silicon-oxygen-germanium (970 $cm^{-1}$) and silicon-oxygen-silicon (1000–1100 $cm^{-1}$) bonds, and carboxylate groups in the acid form (1712 $cm^{-1}$). From proton nuclear magnetic resonance (H—NMR) spectroscopy, the dimethyl germanium containing groups comprised 7.7 mol %, the dimethyl silicon containing groups comprised 68.8 mol %, and the methyl carboxypropyl silicon containing groups comprised 23.5 mol %. Thus, the composition of this CPGS is represented stoichiometrically, but not necessarily in terms of monomer sequence, by Formula 3, wherein all R groups are methyl and where n, m, k are the mote fractions such that n+m+k=1, and n=0.077, m=0.688 and k=0.235.

5. Preparation of Vinyl Containing Carboxylated Polygermanosiloxane, CVPGS.

A carboxylated polygermanosiloxane polymer containing vinyl groups was prepared as follows. First, 0.7343 g H100PSI, 0.6804 g NaOH and 10 mL of water were mixed together and kept in a capped bottle for 16 hours. The resultant solution was placed in a 125 mL flask. In another bottle, 0.83 mL of dimethyldichlorogermane, 0.47 mL of methylvinyldichlorosilane, and 1.58 mL of dimethyldichlorosilane were mixed together with 60 mL of diethyl ether. Then, the mixture also was added to the flask. The two phases were stirred for 4 hours at 25° C. The diethyl ether phase was separated and dried with anhydrous sodium sulfate. Then, the ether was evaporated from the ether solution at reduced pressure to yield a carboxyl and vinyl containing polygermanosiloxane in which about 14 mol % of the groups contained carboxylic acid containing substituents, 10 mol % had vinyl containing substituents, and about 20 mol % of the groups contained germanium. The general Formula 4 applies to this material, with $R_1$ through $R_6$ being methyl groups and $R_7$ being vinyl in this case. Generally, the groups are alkyl and/or alkene, and the in-chain units can be randomly arranged along the chain.

Formula 4

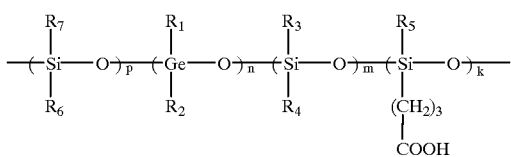

6. Preparation of Carboxyl-Containing Germanium Sesquioxide Siloxane Copolymer, or CGSS.

Carboxyl-containing germanium sesquioxide copolymers used as precursors in the invention have the following general Formula 5 in which $R_1$ and $R2$ can be alkyl groups, such as methyl groups, or alkene groups, such as vinyl groups, and $R_3$ is an alkyl or substituted fragment, such as $CH_2CH_2$, and n, a, b, c are mole fractions such that $n+a+b+c=1$ with $n/(n+a+b+c)$ ranging from 0.01 to 0.33.

Formula 5

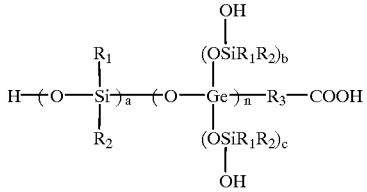

The preparation of a germanium sesquioxide siloxane copolymer (CGSS) was carried out as follows. In this preparation, 1.0065 g of carboxyethyl germanium sesquioxide (obtained from Gelest Inc, Tullytown Pa., Cat No GE C2100) was combined with 20.0 mL of water and 0.95 g of sodium hydroxide and allowed to react for 12 hours at 70° C. in a capped glass bottle. Then this product was cooled to 25° C. and placed in a 250 mL single neck round bottom flask with 50 mL of diethylether and 6.5 mL of dichlorodimethylsilane (Aldrich Chemical Co., Cat No. D6,082-6) and a reflux condenser was placed in the neck. This mixture was stirred for 3 hours at 25° C. Then the ether phase containing the product was dried with anhydrous sodium sulfate. This drying solid was separated from the ether phase. The ether was removed from the ether phase under reduced pressure.

The resultant viscous product is believed to be represented by the general Formula 5.

The existence of the germanium-oxygen-silicon (970 cm$^-$) silicon-oxygen-silicon (1000–1100 cm$^{-1}$) and carboxylate groups (1712 cm$^{-1}$) as well as the features expected from the formula, such as $CH_3$ on Si at 1260 cm$^{-1}$, was shown by infrared spectroscopy. The H—NMR spectrum of the product was obtained and interpreted to show that $n/(a+b+c)$ is 7.5/92.5 or 0.081 for this example.

7. Preparation of a Carboxyl and Vinyl Containing Germanium Sesquioxide Polygermanosiloxane (CVGSS) Copolymer A CVGSS material was obtained by first combining 1.5067 g carboxyethyl germanium sesquioxide, 1.4217 g of NaOH and 20 mL of water in a glass bottle. The bottle then was capped and put into an oven at 70° C. for 16 hours. The solution in the bottle was transferred to a 125 mL round bottom flask, and then 50 mL of diethyl ether was added to the top of the solution in the flask. It was a two phase system. Then, 1.55 mL of methylvinyldichlorosilane and 4.67 mL of dimethyidichlorosilane were added slowly to the diethyl ether phase in the flask. The water phase was stirred gently so that the two silanes in the diethyl ether phase could react at the interface with the germanium sesquioxide reaction product in the water phase to form the carboxyl and vinyl containing polygermanosiloxane. The product in the diethyl ether phase was transferred to another flask and the solution was dried with anhydrous sodium sulfate. The polygermanosiloxane in which about 15 mol % of the units contained carboxyl groups and 20 mol % contained vinyl groups was achieved after the solvent was removed under vacuum. The CVGSS polymers can be represented by general Formula 6, in which, for this example, $R_1$ and $R_2$ are methyl, $R_3$ is $C_2H_4$, and $R_4$ is vinyl ($CHCH_2$), and n, a, b, c, d, e and f are mole fractions such that $n/(n+a+b+c+d+c+f)$ is 0.15, $(d+e+f/(n+a+b+c+d+e+f)$ is 0.2 and $(a+b+c)/(n+a+b+c+d+e+f)$ is 0.65.

Formula 6

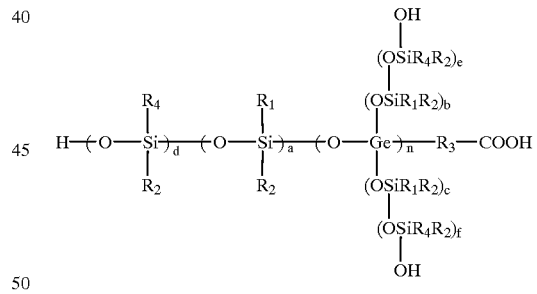

8. Preparation of a Carboxyl and Vinyl Containing Polygermanosiloxane (CVGSS) Copolymer Another CVGSS material represented by the general Formula 6 was obtained by first combining 1.4967 g carboxyethyl germanium sesquioxide, 1.42 g of NaOH and 20 mL of water in a glass bottle. The bottle then was capped and put into an oven at 70° C. for 16 hours. The solution in the bottle was transferred to a 125 mL round bottom flask, and then 50 mL of diethyl ether was added to the top of the solution in the flask. It was a two phase system. Then, 2.30 mL of methylvinyldichlorosilane and 3.90 mL of dimethyldichlorosilane were added slowly to the diethyl ether phase in the flask. The water phase was stirred gently so that the two silanes in the diethyl ether phase could react at the interface with the germanium sesquioxide reaction product in the water phase to form the carboxyl and vinyl containing polygermanosiloxane. The product in the diethyl ether phase was transferred to another flask and the solution was dried with anhydrous sodium sulfate. The polygermanosiloxane in which about 15 mol % of the units contained carboxyl groups and 30 mol % contained vinyl groups was achieved after the solvent was removed under vacuum. 9. Preparation of a Germanium Ester of a Carboxylated Polysiloxane, or GEPSI.

The germanium esters of carboxylated polysiloxane used as precursors in the invention have the following general Formula 7 in which $R_1$–$R_5$ are alkyl or alkenyl groups, such as methyl groups, and $R_6$ is an alkyl or substituted alkyl fragment, such as $CH_2CH_2$, X is H or C (from another carboxylate group), and n, m and k are mole fractions such that n+m+k=1 with m/(m+k) ranging from 0.10 to 0.80 and n/(n+m+k) ranging from 0.10 to 0.90, wherein (m+K) is the total number of carboxylated groups in the acid germanium ester forms.

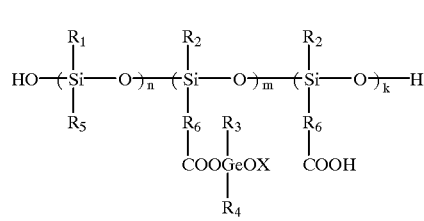

Formula 7

The preparation of an approximately 20 mol % germanium ester of H100PSI, was carried out as follows. First, 0.4525 g of H100PSI was dissolved in 10.0 mL of ethanol. Also, 0.0759 g of tetrameric dimethylgermanium oxide (which was synthesized from dichlorodimethylgermane (Gelest, Inc) according to method described by Rochow (M. P. Brown and E. G. Rochow J. Am. Chem. Soc., 82, 4166(1960)) was dissolved in 1.0 mL of water at room temperature for 4 hours. The two solutions were mixed in a 20 mL bottle. The mixture in the uncapped bottle was then held in a drying oven at 70° C. for 12 hours to evaporate the ethanol and water. The product in the bottle then was dried in a vacuum oven at 60° C. for 4 hours. The product can be shown in one representation as given by Formula 7, where all R groups are methyl and X can be H, Ge, Si or C. It appears that X initially and for sometime (about 1 week or more, depending on temperature and other conditions) is H primarily. However, since the viscosity of the product increases gradually with time, it appears that condensation occurs between these OH groups and other carboxylates or Si—OH end groups to form larger molecules. Thus, a range of viscosities and products can be obtained by controlled aging of the initial product.

The infrared spectrum of the initial product shows the germanium ester form (1688 cm$^{-1}$) in addition to the expected features of H100PSI. The germanium to silicon mole ratio overall is 0.21, or about 0.2 or 2 to 10. Thus, about 20% of the Si units in H100PSI have been formed into germanium ester form.

10. Preparation of a Germanium Ester of a Carboxylated Polysiloxane, or GEPSI

The preparation of another germanium ester of H100PSI, also corresponding to formula 7, was carried out by the method given in preparation 9 (above) but with the following amounts of reactants. First, 0.1291 g of tetrameric germanium oxide was dissolved in 1 mL of water. Then, 0.2384 g of H100PSI was dissolved in 10 mL of ethanol. The two solutions were mixed together and the product was dried in an oven at 70° C. overnight. The germanium to silicon mole ratio is about 6.7 to 10. About 67% of the Si containing units in H100PSI have been formed into germanium ester form.

11. Preparation of Vinyl-containing Polygermanosiloxane; VPGS.

0.669 g of [GeO(CH$_3$)$_2$]$_4$ was dissolved in 1.5 mL of H$_2$O. The solution was added to a flask with 1.4794 g of NaOH. 30 mL of petroleum ether was then added to the flask. 1 mL of dichloromethylvinylsilane was added to the petroleum ether phase. The two-phase system was gently stirred at room temperature for 30 minutes, and then refluxed for 4 hours. The petroleum ether solution was decanted from the flask to another flask. The petroleum ether solution was then dried with anhydrous sodium sulfate overnight. The solvent was evaporated under vacuum. The composition of the compound is represented by the following general Formula 8:

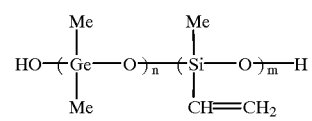

Formula 8 where n/(n+m)=0.42 and m/(n+m)=0.58

B. FORMATION OF FILMS, PATTERNS AND MULTILAYERS

For the formation Silica films and germnanosilicate films, a catboxylated polysiloxane or a carboxylated polygermanosiloxane is deposited on a substrate such as a silicon wafer through dip coating method or using a spin coater. The polymer film is dried and thermally oxidized into silica or germanosilicate films by carefully designed time-temperature program described in the detail below. However, it is also possible to use other means to oxidize the polymer film into silica or germanosilicate film.

For the formation of patterns of silica or germanosilicate, the polymer film on a substrate is first exposed to light (such as ultraviolet light) or other radiation through a mask. The uncross-linked materials in the film is then washed away by a solvent such as ethanol, acetone or ethyl ether, leaving the polymer patterns on the substrate. The polymer precursors on the substrate are then oxidized into silica or germanosilicate patterns.

For the formation patterns of metal silicate or metal germanosilicate, the polymer patterns formed according the steps mentioned above are first ion-exchange with a metal acetylacetonate or other organic compounds to form metal doped polymer patterns which are subsequently oxidized into metal doped silicate patterns.

Application and production of the films, patterned films, multilayer films and other objects will become apparent from the detailed Examples given below.

EXAMPLE 1: SILICA FILM ON SI FROM H100PSI

A solution of 0.6 g H100PSI in 10 mL absolute ethanol was made (see above) and 0.2 mL was added dropwise to an area of about 2 cm of the surface of a Si wafer (Si(111), p-type). See FIG. 1. This made a film containing about 0.011 g covering an area of 2 cm$^2$. This then was placed in a tube furnace and heated in air according to the following schedule it was heated from 25° C. to 200° C. at 40° C./min held at 200° C. for 30 min; heated to 250° C. at 40° C./min, held at 200° C. for 30 min; heated to 250° C. at 40° C./min; held at 250° C. for 15 min; heated to 510° C. at 40° C./min; held at 510° C. for 60 min; heated to 550° C. at 40° C./min; held at 550° C. for 30 min; heated to 600° C. at 40° C./min; and held at 600° C. for 135 min. Then the furnace was turned off and then cooled to about 40° C. and the sample was removed. The infrared spectrum showed the film to be of silica composition, essentially free of residual organics and to have an infrared estimated thickness of 1.6μ.

EXAMPLE 2: SILICA FILM ON SI FROM H100PSI

Example 1 was repeated with about 0.15 mL of solution over about 2 cm² surface on another piece of the same type of Si wafer. The infrared spectrum of the product film exhibited an infrared spectrum of a silica composition, free of residual organics. The thickness estimated from that spectrum is 1.2μ. The refractive index and thickness also were measured using a Metricon Model 2010 Prism Coupler using a He—Ne laser at 632.8 nm. The thickness was found to be 1.36 μm and the refractive index at 632.8 nm was 1.4143.

EXAMPLE 3: SILICA FILM ON SI FROM H100PSI

The general method of having 0.6 g H100PS in 10 mL absolute alcohol, and 0.3 mL of this example was repeated with another H100PS solution was deposited over about 1.5 cm surface area on another piece of the Si wafer. The heating process was similar to that of Example 1 except that the sample was heated at 500° C. instead of 510° C. and at 530° C. for 20 minutes instead of 550° C. for 30 minutes. The infrared spectrum showed the film to be of silica composition with no residual organic material and to be of infrared estimated thickness of 1.4μ. The thickness and refractive index, in the central region of the film by ellipsometry using an Auto EIR-II Automatic Ellipsometer (Rudolph Research/Auto EL) using 632.8 nm laser light, were formed to be 1.504μ and 1.445, respectively.

EXAMPLE 4: SILICA FILM ON SI FROM H50PSI

A 5×10⁻⁴ g sample of H50PSI was deposited on 2 cm² surface area of a Si wafer (Si(111), p-type) from an absolute ethanol solution containing about 5 weight percent Irgacure 184. It was dried in a vacuum oven at 100° C. for 60 min. and then placed in a Rayonette UV reactor with low pressure Hg bulbs for 210 min. at about 50° C. (cooling condition). Then this was heated in computer programmed furmace (CM Rapid Temp 1700B Furnace) in air. The temperature program used was such that the temperature rose from 25° C. to 150° C. over 10 min., then it was held at 150° C. for 10 min, then it rose to 250° C. over 10 min, then it held at 250° C. for 40 min, then it rose to 300° C. over 40 min, then it held at 300° C. for 60 min, then it rose to 500° C. over 400 min, then it held at 500° C. for 60 min, then it rose to 600° C. over 100 min and was held there for 60 min. Then the furnace was allowed to cool to about 40° C. and the sample was removed.

The infrared spectrum of the film showed that the film is a silica composition. with an infrared estimated thickness of 1.3μ. The thickness and refractive index, measured by ellipsometry (as described above) at 632.8 nm, were 1.32μ and 1.421, respectively.

EXAMPLE 5: SILICA FILM ON SI FROM H14PSI

A piece of silicon wafer (Si (111), P type) was cleaned with acetone and ethanol. (H14PSI in ether) The ether solution of H14PSI was added to the wafer (about 2 cm²). The weight of H14PSI was 0.035 g. The H14PSI film on the silicon wafer was heated in a Lindberg Tube furnace from room temperature to 300° C. at 40° C./min, held at 300° C. for 90 min, heated from 300° C. to 400° C. at 40° C./min, held at 400° C. for 10 min, heated from 400° C. to 600° C. at 40° C./min, held at 600° C. for 60 min. The IR spectrum of the silica film on the silicon wafer showed the thickness of the film about 0.5 μm. The refractive index of the film was measured by ellipsometer(as described in Example 3). The refractive index was 1.410.

EXAMPLE 6: GERMANOSILICATE FILM FROM VPGS

A piece of silicon wafer (Si(111), p type) was cleaned with ethanol and acetone. The vinyl containing polygermanosiloxane (VPGS, shown in Preparation 12) with Irgarare 184 (5 wt %) was added to the surface of the silicon wafer. The sample was heated in a tube furnace under $O_2$ flow room temperature to 400° C. at 40° C./min, held at 400° C. for 60 min, from 400° C. to 600° C. from 40° C./min, held at 600° C. for 60 min. The IR spectrum of germanium containing silicate film showed the thickness of the film is about 0.3 μm.

EXAMPLE 7: GERMANOSILICATE FILM FROM CPGS

A piece of silicon wafer (Si(111), P type) was cleaned with ethanol and acetone. The wafer was dip coated with a carboxylated polygermanosiloxane (0.6 g CPGS polymer in 10 ml diether ether). The polymer film on the rough side of the wafer was cleaned with acetone. The sample was put in a platinum boat and heated in a tube furnace from room temperature to 200° C. at 400° C./min, held at 200° C. for 35 min, to 500° C. at 40° C./min held at 500° C. for 85 min, to 550° C. at 40° C./min, held at 550° C. for 30 min, to 600° C. at 40° C.lmin, held at 600° C. for 115 min. The infrared spectrum of the germanium containing silicate film showed the thickness of the film is about 0.5 μm.

EXAMPLE 8: GERMANOSILICATE FILM FROM CGSS

A piece of silicon wafer was cleaned witt ethanol and acetone. The wafer was dip coated with a carboxylated germanium sesquioxide siloxane (CGSS) copolymer with Ge/Si=10/90. The sample was placed in a Lindberg tube furnace and heated from room temperature to 200° C. at 40° C./min., held at 200° C. for 30 minutes, heated from 200 to 250° C. at 40° C./min., held at 250° C. for 45 minutes, heated from 250 to 500° C. at 40° C./min., held at 500° C. for 60 minutes, heated from 500 to 550° C. at 40° C./min., held at 550° C. for 55 minutes, heated from 550 to 600° C. at 40° C./min., held at 600° C. for 135 minutes. The infrared spectrum of the germanosilicate film on the silicon wafer showed the thickness of the film is about 0.3 μm.

EXAMPLE 9: GERMANOSILICATE FILM FROM GE-20-PS-100

A piece of silion wafer (Si(111), p-type) was cleaned with ethanol and acetone. 0.5 mL of GE-20-PS-100 ethanol solution (0.4 g in 6 mL of ethanol) was added to the surface of the silicon wafer. The sample was dried in air for 1 hour and in a vacuum oven for 1 hour. The sample was then heated on a hot plate (about 200° C.) for 5 minutes. The sample was then placed in a Lindberg tube furnace and heated from room temperature 200° C. at 40 ° C./min., held at 200° C. for 30 minutes, heated from 200 to 250° C. at 40° C./min, held at 250° C. for 15 minutes, heated from 250 to 500° C. at 40° C./min, held at 500° C. for 90 min., heated from 500 to 550° C. at 40° C./min, held at 550° C. for 30 minutes, heated from 550 to 600° C. at 40° C./min, held at 600° C. for 170 minutes. The infrared spectrum of the germanate glass film on the silicon wafer showed that the thickness of the film is about 1.5 $\mu$m.

EXAMPLE 10: GERMANOSILICATE FILM FROM GE-67-PS-100

A piece of silicon wafer (Si(111), p-type) was cleaned with ethanol and acetone. 0.5 mL of GE-40-PS-100 ethanol solution (0.3 g in 6 mL of ethanol) was added to the surface of the silicon wafer. The sample was dried in air for 1 hour and in a vacuum oven for 1 hour. The sample was then heated on a hot plate (about 200° C.) for 5 minutes. The sample was then placed in a Lindberg tube furnace and heated from room temperature 200° C. at 40° C./min., held at 200° C. for 30 minutes, heated from 200 to 250° C. at 40° C./min, held at 250° C. for 15 minutes, heated from 250 to 500° C. at 40° C./min, held at 500° C. for 75 minuts, heated from 500 to 550° C. at 40° C./min, held at 550° C. for 20 minutes, heated from 550 to 600° C. at 40° C./min, held at 600° C. for 190 minutes. The infrared spectrum of the germanate glass film on the silicon wafer showed that the thickness of the film is about 0.7 $\mu$m.

EXAMPLE 11: FILM OF $Na_2O.2SiO_2$

A solution of H100PSI was made to have 0.425 g of H100PSI in 6 mL of absolute ethanol. This was combined with a solution made by dissolving 0.1166 g NaOH in 8 mL of $H_2O$. Drops of this solution were placed on a Si wafer (Si(111)p-type) in air. About 0.5 mL was placed on an area of about 2 cm². The solvent was allowed to evaporate slowly and then the wafer was placed in a tube furnace and heated under $O_2$. The heating was done according to the following program: first it was heated from room temperature to 250° C. at 40° C./min and held there for 30 min; then it was heated to 300° C. at this rate and held there for 30 min; then it was heated to 350° C. at this rate and held there for 30 min; then to 400° C. at this rate and held there for 30 min; then to 450° C. at this rate and held there for 30 min; then to 500° C. at this rate and held there for 30 min; and finally to 550° C. at this rate and held there for 30 minutes. The sample was cooled slowly as the furnace cooled after being turned off.

The infrared spectrum of the film showed it to be nearly identical to that of the known spectrum of $Na_2O. 2SiO_2$. The thickness was estimated to be 0.5 $\mu$m from the spectrum.

EXAMPLE 12: FILM OF $Na_2O.3SiO_2$

The procedure of Example 9 was repeated except that 0.3450 g of H100PSI was dissolved in 6 mL of absolute ethanol. This was combined with a solution made by dissolving 0.0630 g of NaOH in 8 mL of $H_2O$. This solution was applied and the material heated as given stated in Example 9. The result was a film whose infrared spectrum is nearly identical to the known spectrum of $Na_2O.3SiO_2$. The thickness was estimated to be 0.6 $\mu$m from the spectrum.

EXAMPLE 13: SILICA PATTERNS

A piece of silicon wafer was dip coated in a solution comprising H14PSI (1.17 g of H14PSI and 5 weight percent Irgacure 184 was dissolved in 10 mL of diethyl ether). The H14PSI film on one side of the wafer was wiped away with diethyl ether on a tissue. A metal mask with 0.1 cm wide slits chemically machined through it was placed 25 $\mu$m above the H14PSI film. This H14PSI film was exposed to UV light from a (Coherent) UV laser (275 nm, 200 mw (~2×10³ w/m²)) for 15 seconds. The film then was washed with diethyl ether to remove uncross-linked H14PSI. This left the cross-linked patterns on the wafer. The silicon wafer with crosslinked H14PSI patterns on it then was heated in a Lindburg tube furnace, under a slow flow of $O_2$ from, room temperature to 400° C. at (about 40° C./min), held at 400° C. for 1 hour, heated from 400 to 600° C. over 5 minutes, and then held at 600° C. for 1 hour. The infrared spectrum showed that the H14PSI was transformed thermally into a silica material in the area of the exposed patterns.

EXAMPLE 14: $Ln_2O_3.42SiO_2$ PATTERNS ON $SiO_2$

Silicon wafers were dip coated with H14PSI solution (0.6 g of H14PSI dissolved in 10 mL of diethyl ether containing about 5 weight percent Irgacure 184). The samples were dried in air for several minutes, and then heated in a Lindburg tube furnace under $O_2$ flow from room temperature to 400° C. over 10 minutes (about 40° C./min), at 400° C. for 1 hour, from 400 to 600° C. over 5 minutes, at 600° C. for 1 hour. The H14PSI films on the silicon wafers were thermally transformed into thin silica films, as shown by its infrared spectrum.

These silica films on Si were used as substrates and were dip-coated with H14PSI from the same solution (above). The resultant H14PSI films were dried in air for 10 minutes, and they were cross-linked through a metal mask with a set of 0.1 cm wide slits in it using UV light from a Coherent UV laser (275 nm, 150 mw, 1.5×10³ W/m² for 15 seconds). The uncross-linked H14PSI was washed away with diethyl ether, and this left the H14PSI patterns on the substrates.

One of the substrates with a pattern of crosslinked H14PSI on it was dipped into a solution of Er(acac)₃ in absolute ethanol (0.1 g Er(acac)₃ in 100 mL absolute ethanol) for 15 min. Another was treated in an analogous Sm(acac)₃ solution; a third in an analogous Tb(acac)₃ solution; and a fourth in an analogous Eu(acac)₃ solution. Each then was washed with ethanol and placed in a tube furnace. Then they were heated according to the following time-temperature program comprising the steps of: a) heating from room temperature to 200° C. at 40° C./min.; b) heating at 200° C. for 30 min.; c) heating from 200° C. to 250° C. in about 1.5 min. and at 250° C. for 30 min.; d) heating from 250° C. to 500° C. in about 6.5 min. and at 500° C. for 80 min; e) heating from 500° C. to 550° C. in about 1.5 min. and at 550° C. for 30 min.; and, f) heating from 550° C. to 600° C. in about 1.5 min. and at 600° C. for 120 min.

EXAMPLE 15: MULTILAYER LANTHANIDE SILICATE FILMS ON SAPPHIRE

Six sapphire substrates (sapphire windows 0.04 in thick from Meller Optics, Inc.) were dip coated with H14PSI solution (prepared by dissolving 0.6 g of H14PSI and 10 wt % Irgacure 184 in 10 mL of diethyl ether). The samples were dried in air for several minutes and then exposed to ultra-violet radiation in a Rayonet Photochemical Reactor with predominant output at 254 nm for about 5 hours. One of these six sapphire substrates with a cross-linked H14PSI coating on on it was dipped into a solution of erbium acetylacetonate (prepared by dissolving 0.1 g erbium acetylacetonate in absolute ethanol) for 18 minutes. The second was treated similarly in a solution of europium (III) acetylacetonate, the third in holmium acetylacetonate, the fourth in neodymium acetylacetonate, the fifth in samarium acetylacetonate, and the sixth in terbium acetylacetonate. The six lanthanide doped crosslinked H14PSI films on sapphire were heated in a furnace under an oxygen flow from room temperature to 400° C. at 40° C./min, kept at 400° C. for one hour, heated from 400° C. to 600° C. at 40° C./min and kept at 600° C. for one hour. Each lanthanide doped crosslinked H14PSI film was found to have been transformed into a lanthanide silicate film. The six samples were treated again by the same procedure, ie dip coating, crosslinking, treatment with the same lanthanide acetylacetonate solution, and heating, as had been done in the first process. The process was repeated for a third and then fourth time, so that each sapphire substrate had on it four layers of a lanthanide silicate. In this way a sample of comprising four layers of erbium silicate on sapphire, a sample of four layers of europium silicate on sapphire, a sample of four layers of holmium silicate on sapphire, a sample of four layers of neodymium silicate on sapphire, a sample of four layers of samarium silicate on sapphire, and a sample of terbium silicate on sapphire were produced.

The invention has been described with reference to the preferred embodiment. Obviously, modifications and alterations will occur to others upon a reading and understanding of the proceeding detailed description. It is intended that the invention be construed as including all such alterations and modifications insofar as they come within the scope of the clims or the equivalent thereof.

Having thus described the invention, it is claimed:

1. A method of producing a silica film on a substrate comprising the steps of:
   a) preparing a carboxylated silicone precursor composition;
   b) applying the carboxylated silicone precursor composition to the surface of a substrate to form a precursor film; and,
   c) thermally oxidizing the precursor film to form a silica film,
      wherein said carboxylated silicone precursor composition is selected from the group consisting of polygermanosiloxanes represented by Formula 3:

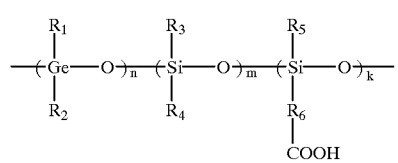

Formula 3 where $R_1$–$R_5$ are alkyl groups, $R_6$ is $(CH_2)_3$ and n, m, and k are relative proportions such that $n+m+k=1$ with $k/(n+m+k)$ ranging from 0.1 to 0.60; and vinyl containing polygermanosiloxane represented by Formula 6

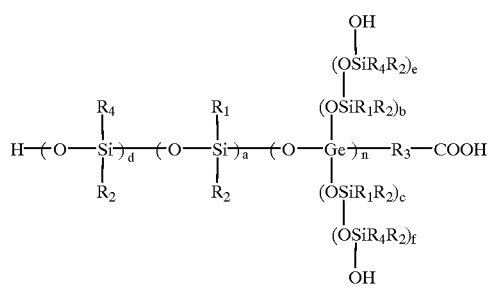

Formula 6 where $R_1$ and $R_2$ are alkyl or alkenyl groups, $R_3$ is an alkane fragment and $R_4$ is vinyl ($CHCH_2$), and n,a,b,c,d,e and f are relative proportions such that $n/(n+a+b+c+d+e+f)$ is from 0.01 to 0.5, $(d+e+f)/(n+a+b+c+d+e+f)$ is from 0.01 to 0.99 and $(a+b+c)/(n+a+b+c+d+e+f)$ is from 0.01 to 0.99.

2. A method of producing a silica film on a substrate comprising the steps of:
   a) preparing a carboxylated silicone precursor composition;
   b) applying the carboxylated silicone precursor composition to the surface of a substrate to form a precursor film; and,
   c) thermally oxidizing the precursor film to form a silica film,
      wherein said carboxylated silicone precursor composition is selected from the group consisting of carboxylated polysiloxanes represented by Formula 2 with $m/(n+m)$ ranging from 0.14 to 0.999

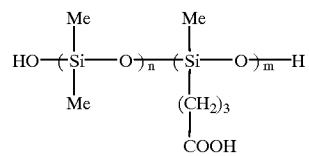

Formula 2

3. The method of claim 2 wherein $m/(n+m)$ is 0.50.
4. The method of claim 2 wherein $m/(n+m)$ is 0.14.
5. A method of producing a silica film on a substrate comprising the steps of:
   a) preparing a carboxylated silicone precursor composition;
   b) applying the carboxylated silicone precursor composition to the surface of a substrate to form a precursor film; and,
   c) thermally oxidizing the precursor film to form a silica film,
      wherein said carboxylated silicone precursor composition is selected from the group consisting of germanium esters of carboxylated polysiloxane represented by Formula 7 with $m+k$ ranging from 0.14 to 0.999

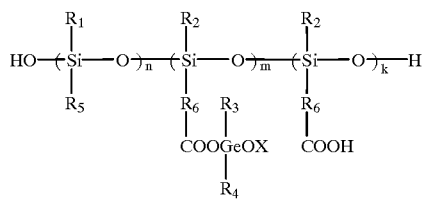

Formula 7 where $R_1$–$R_5$ are alkyl or alkenyl groups, $R_6$ is an alkyl or substituted alkyl fragment, X is H or a linkage to another carboxyl group and n, m and k are relative proportions such that $n+m+k=1$ with $m/(m+k)$ ranging from 0.10 to 0.80 and $n/(n+m+k)$ ranging from 0.10 to 0.90.

6. A method of forming a silica film having a pattern on a substrate comprising the steps of:
   a) preparing a carboxylated silicone precursor composition;
   b) depositing the carboxylated silicone precursor composition on the surface of a substrate to form a precursor film;
   c) masking the precursor film with a mask having the pattern;

d) exposing the masked precursor film to radiation thereby cross-linking the unmasked precursor film to form the pattern;

e) removing the mask;

f) washing the precursor film with an organic solvent to remove uncrosslinked precursor film from the substrate and leaving a cross-linked precursor film in the form of the pattern on the substrate; and, g) thermally oxidizing the cross-linked precursor film to form the pattern of silica film on the substrate; wherein said carboxylated silicone precursor composition is selected from the group consisting of vinyl containing polygermanosiloxane represented by Formula 8:

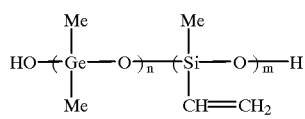

Formula 8 where n/(n+m) is 0.42, and carboxylated polygermanosiloxane represented by Formula 3:

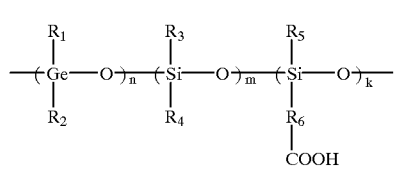

Formula 3 where $R_1$–$R_5$ are alkyl groups, $R_6$ is $(CH_2)_3$ and n, m, and k are relative proportions such that n+m+k=1 with k/(n+m+k) ranging from 0.1 to 0.60.

7. A method of forming a silica film having a pattern on a substrate comprising the steps of:

a) preparing a carboxylated silicone precursor composition;

b) depositing the carboxylated silicone precursor composition on the surface of a substrate to form a precursor film;

c) masking the precursor film with a mask having the pattern;

d) exposing the masked precursor film to radiation thereby cross-linking the unmasked precursor film to form the pattern;

e) removing the mask;

f) washing the precursor film with an organic solvent to remove uncrosslinked precursor film from the substrate and leaving a cross-linked precursor film in the form of the pattern on the substrate; and, g) thermally oxidizing the cross-linked precursor film to form the pattern of silica film on the substrate; wherein said carboxylated silicone precursor composition is selected from the group consisting of carboxylated polysiloxanes represented by Formula 2 with m/(n+m) ranging from 0.14 to 0.999

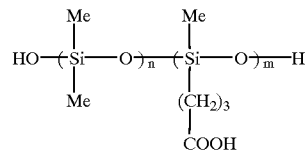

Formula 2

8. A method of forming a silica film having a pattern on a substrate comprising the steps of:

a) preparing a carboxylated silicone precursor composition;

b) depositing the carboxylated silicone precursor composition on the surface of a substrate to form a precursor film;

c) masking the precursor film with a mask having the pattern;

d) exposing the masked precursor film to radiation thereby cross-linking the unmasked precursor film to form the pattern;

e) removing the mask;

f) washing the precursor film with an organic solvent to remove uncrosslinked precursor film from the substrate and leaving a cross-linked precursor film in the form of the pattern on the substrate; and, g) thermally oxidizing the cross-linked precursor film to form the pattern of silica film on the substrate; wherein said carboxylated silicone precursor composition is selected from the group consisting of germanium esters of carboxylated polysiloxane represented by Formula 7 with m+k ranging from 0.14 to 0.999

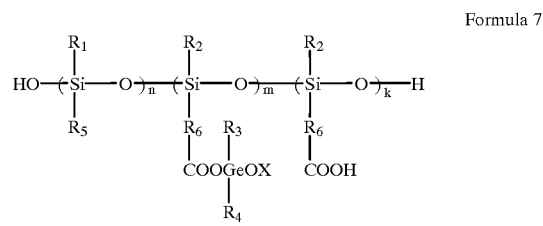

Formula 7 where $R_1$–$R_5$ are alkyl or alkenyl groups, $R_6$ is an alkyl or substituted alkyl fragment, X is H or a linkage to another carboxyl group and n, m and k are relative proportions such that n+m+k=1 with m/(m+k) ranging from 0.10 to 0.80 and n/(n+m+k) ranging from 0.10 to 0.90.

9. A method of forming a metal doped silicate film on a substrate comprising the steps of:

a) preparing a carboxylated silicone precursor composition;

b) depositing the carboxylated silicone precursor composition on the surface of a substrate to form a precursor film;

c) exposing the precursor film to radiation thereby cross-linking the precursor film;

d) applying to the cross-linked precursor film a metal organic composition thereby forming a metal doped precursor film by ion exchange; and, e) thermally oxidizing the metal doped precursor film to form a metal doped silicate film, wherein said carboxylated silicone precursor composition is selected from the group consisting of carboxylated polysiloxanes represented by Formula 2 with M/(n+m) ranging from 0.14 to 0.999

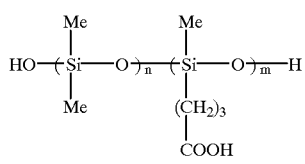

Formula 2

10. A method of forming a metal doped silicate film on a substrate comprising the steps of:
    a) preparing a carboxylated silicone precursor composition;
    b) depositing the carboxylated silicone precursor composition on the surface of a substrate to form a precursor film;
    c) exposing the precursor film to radiation thereby cross-linking the precursor film;
    d) applying to the cross-linked precursor film a metal organic composition thereby forming a metal doped precursor film by ion exchange; and,
    e) thermally oxidizing the metal doped precursor film to form a metal doped silicate film, wherein said carboxylated silicone precursor composition are germanium esters of carboxylated polysiloxanes represented by Formula 7 with m+k ranging from 0.14 to 0.999

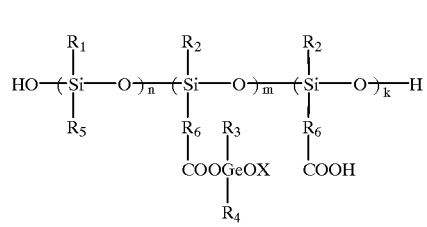

Formula 7 where $R_1$–$R_5$ are alkyl or alkenyl groups, $R_6$ is an alkyl or substituted alkyl fragment, X is H or a linkage to another carboxyl group and n, m and k are relative proportions such that n+m+k=1 with m/(m+k) ranging from 0.10 to 0.80 and n/(n+m+k) ranging from 0.10 to 0.90.

11. A method of forming a pattern of metal doped silicate film on a substrate comprising the steps of:
    a) preparing a carboxylated silicone precursor composition;
    b) depositing the carboxylated silicone precursor composition on the surface of a substrate to form a precursor film;
    c) masking the precursor film with a mask having the pattern;
    d) exposing the masked precursor film to radiation thereby cross-linking the unmasked precursor film to form the pattern;
    e) removing the mask;
    f) washing the precursor film with an organic solvent to remove the uncrosslinked precursor film from the substrate and leaving the cross-linked precursor film on the substrate in the form of a pattern;
    g) applying a metal organic composition to the cross-linked precursor film thereby forming by ion-exchange a metal doped precursor film; and h) thermally oxidizing the metal doped precursor film to form the pattern of a metal doped silicate film on a substrate, wherein said carboxylated silicone precursor composition is selected from the group consisting of carboxylated polysiloxanes represented by Formula 2 with m/(n+m) ranging from 0.14 to 0.999

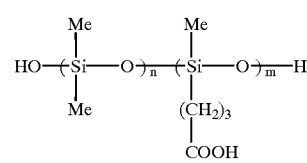

Formula 2

12. A method of forming a pattern of metal doped silicate film on a substrate comprising the steps of:
    a) preparing a carboxylated silicone precursor composition;
    b) depositing the carboxylated silicone precursor composition on the surface of a substrate to form a precursor film;
    c) masking the precursor film with a mask having the pattern;
    d) exposing the masked precursor film to radiation thereby cross-linking the unmasked precursor film to form the pattern;
    e) removing the mask;
    f) washing the precursor film with an organic solvent to remove the uncrosslinked precursor film from the substrate and leaving the cross-linked precursor film on the substrate in the form of the pattern;
    g) applying a metal organic composition to the cross-linked precursor film thereby forming by ion-exchange a metal doped precursor film; and
    h) thermally oxidizing the metal doped precursor film to form the pattern of a metal doped silicate film on a substrate, wherein said carboxylated silicone precursor composition is selected from the group consisting of germanium esters of carboxylated polysiloxane represented by Formula 7 with m+k ranging from 0.14 to 0.999

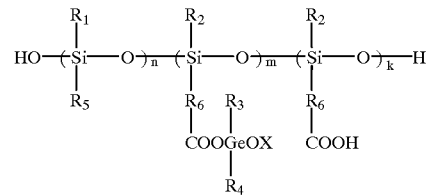

Formula 7 where $R_1$–$R_5$ are alkyl or alkenyl groups, $R_6$ is an alkyl or substituted alkyl fragment, X is H or a linkage to another carboxyl group and n, m and k are relative proportions such that n+m+k=1 with m/(m+k) ranging from 0.10 to 0.80 and n/(n+m+k) ranging from 0.10 to 0.90.

13. A method for the preparation of polygermanosiloxanes of the general formula $XO(SiR_1R_2O)_n(GeR_3R_4O)_mX$, wherein $R_1$–$R_4$ are alkyl or alkenyl groups with one to eight carbons and X is hydrogen or a capping group comprising alkyl, alkenyl, silyl, or germyl groups, said method comprising the steps of reacting a germanium salt in a polar solvent and recovering the product polygermanosiloxane compound from the non-polar phase.

14. Compounds prepared by the method of claim 13, wherein $R_1$, $R_2$ and $R_3$ are methyl groups and $R_4$ is vinyl and n/(n+m) is in the range 0.01 to 0.67.

15. A method of producing a silica film on a substrate comprising the steps of:

a) preparing a polygermanosiloxane precursor composition of the general formula $XO(SiR_1R_2O)_n(GeR_3R_4O)_mX$, wherein $R_1$–$R_4$ are alkyl or alkenyl groups with two to eight carbons and X is hydrogen or a capping group comprising alkyl, alkenyl, silyl, or germyl groups;

b) applying the polygermanosiloxane precursor composition to the surface of a substrate to form a precursor film; and, c) thermally oxidizing the precursor film to form a silica film.

\* \* \* \* \*